(12) United States Patent
Kelin et al.

(10) Patent No.: US 8,290,097 B2
(45) Date of Patent: Oct. 16, 2012

(54) MULTI-CHANNEL SEQUENTIAL VITERBI DECODER

(75) Inventors: Timur G. Kelin, Moscow (RU); Dmitry D. Murzinov, Moscow (RU); Dmitry A. Pyatkov, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 144 days.

(21) Appl. No.: 13/059,244

(22) PCT Filed: Apr. 19, 2010

(86) PCT No.: PCT/RU2010/000182
§ 371 (c)(1),
(2), (4) Date: Feb. 16, 2011

(87) PCT Pub. No.: WO2011/105923
PCT Pub. Date: Sep. 1, 2011

(65) Prior Publication Data
US 2011/0211660 A1    Sep. 1, 2011

(30) Foreign Application Priority Data
Feb. 27, 2010 (RU) .................................. 201007005

(51) Int. Cl.
*H04L 27/06* (2006.01)
(52) U.S. Cl. ........ 375/341; 375/262; 375/265; 704/242; 714/795
(58) Field of Classification Search .................. None
See application file for complete search history.

(56) References Cited

U.S. PATENT DOCUMENTS

| | | | |
|---|---|---|---|
| 6,819,630 | B1 | 11/2004 | Blackmon et al. |
| 7,636,879 | B2 | 12/2009 | Saito et al. |
| 7,725,798 | B2 | 5/2010 | Ebert et al. |
| 2009/0193323 | A1 | 7/2009 | Park et al. |
| 2010/0157901 | A1 | 6/2010 | Sanderovitz et al. |

FOREIGN PATENT DOCUMENTS

| | | |
|---|---|---|
| CN | 1329411 | 1/2002 |
| EP | 1696584 | 3/2006 |
| KR | 2006001864 | 5/2006 |
| RU | 2222110 | 9/1994 |
| RU | 2010000182 | 4/2010 |

OTHER PUBLICATIONS

Search report in PCT/RU2010/000182, dated Oct. 28, 2010.

*Primary Examiner* — David C. Payne
*Assistant Examiner* — Adolf Dsouza
(74) *Attorney, Agent, or Firm* — Bardmesser Law Group

(57) ABSTRACT

A multi-channel sequential Viterbi decoder includes: an input data buffer, a "Read Single Data Word from Input Data Buffer" signal driver, a processing unit selector, a decoder channel parameters registers unit, a processing unit for the "Reset Path Metrics" command, a processing unit for the "Set Path Metric Value for the Given Path Number" command, a processing unit for the "Get Single Bit from the Path with Given Number" command, a processing unit for the "Process Input Samples" command, a decoding paths and path metrics RAM, a unit for generating current decoder channel base address for the decoding paths and path metrics RAM, a unit for generating cell address for the decoding path and path metric RAM, and a data buffers unit for decoder channels output.

20 Claims, 3 Drawing Sheets

| Binary Value | Description |
|---|---|
| 0111 | Most likely value of the input counter for the symbol "1" |
| 0110 | Intermediate value of the input counter for the symbol "1" |
| 0101 | Intermediate value of the input counter for the symbol "1" |
| 0100 | Intermediate value of the input counter for the symbol "1" |
| 0011 | Intermediate value of the input counter for the symbol "1" |
| 0010 | Intermediate value of the input counter for the symbol "1" |
| 0001 | Least likely value of the input counter for the symbol "1" |
| 0000 | Indeterminate value of the input counter |
| 1111 | Least likely value of the input counter for the symbol "0" |
| 1110 | Intermediate value of the input counter for the symbol "0" |
| 1101 | Intermediate value of the input counter for the symbol "0" |
| 1100 | Intermediate value of the input counter for the symbol "0" |
| 1011 | Intermediate value of the input counter for the symbol "0" |
| 1010 | Intermediate value of the input counter for the symbol "0" |
| 1001 | Most likely value of the input counter for the symbol "0" |
| 1000 | Indeterminate value of the input counter |

MULTI-CHANNEL SEQUENTIAL VITERBI DECODER

CROSS-REFERENCE TO REALATED APPLICATION

This Application claims priority to PCT/RU2010/000182 filed on Apr. 19, 2010, which claims priority to RU 2010107005, filed on Feb. 27, 2010.

BACKGROUND OF THE INVENTION

1. Field of the Invention

The invention generally relates to systems with sequential decoding of data streams in noisy channels and, more specifically, to sequential Viterbi decoders for convolutional single-input-multiple-outputs (SIMO)-structured punctured and non-punctured codes where input data for decoding channels is sequentially processed, i.e., processing of data for the next decoding channel starts only after the processing of the current decoding channel has been completed.

2. Description of the Related Art

Convolutional coding is widely used in satellite data transmission channels, for example, in data transmission channels of the radio navigation satellite systems (Global Navigation Satellite Systems (GNSS): GPS L5, GPS L2C, Galileo), as well as communications systems to transmit differential GNSS corrections from geosynchronous orbit satellites (WAAS, EGNOS).

There are multi-channel sequential Viterbi decoders which serve as decoders for data streams (see, for example, U.S. Pat. Nos. 7,246,298, 73,430,704, WO2009077340, US2008298513 and RU2252487). However, these technical solutions only allow for processing continuous streams of data with convolutional coding. Also, multi-rate decoders are known. A conventional multi-rate decoder is intended for communication systems where bit data transmitted at one bit data rate from the first set of predetermined bit data rates $R_i$ are encoded to obtain code symbol data. The code symbol data is transmitted in frames which include code symbol data representing the first version and $(N_i-1)$ repeated versions of encoded original bit data, where $N_i$ and i are non-zero positive integers.

The multi-rate decoder is designed to output decoded bit data corresponding to the first version of the coded original bit data. The multi-rate decoder includes: an input buffer for receiving and storing at least one frame of code symbol data, a sequential decoder connected to the input buffer to generate a packet i of decoded bit data corresponding to a respective one of at least two predetermined data bit rates $R_i$ in response to code symbol data; an output buffer connected to the sequential decoder to store at least two packets $P_i$ of decoded bit data; a symbols transfer unit within the input buffer for selecting a set of code symbol data $S_i$ corresponding to the first version of coded original bit data for each at least two predetermined original bit data rates $R_i$ and for transferring a set of code symbol data $S_i$ to the serial decoding unit and a quality metrics unit of the sequential decoder to generating a quality measure $Q_i$ for each decoded bit data packet $P_i$, quality measure $Q_i$ representing the number of code symbol data errors associated with each decoded bit data packet $P_i$.

The sequential decoder includes a symbol metric unit for assigning a symbol metric value to each code symbol in accordance with the second coding algorithm, a branch metric calculator unit coupled to the symbol metric unit for creating a pair of branch metric values representing the weighted original data bit transmission probability corresponding to each code symbol from the input buffer in response to corresponding the symbol metric value, a decision path unit coupled to the branch metric calculator for generating and storing a state metric decision value for each possible original data bit transition corresponding to each code symbol of the input buffer in response to the corresponding branch metrics values, and a backward path chain unit coupled to the decision path unit for selecting the most probable decision path for each original data bit transition and for creating corresponding decoded data bit (see RU 2222110 or U.S. Pat. No. 5,710,784).

The multi-rate decoder decodes at several data transmission rates related to multi-rate vocoders and also is able to decode at unknown data transmission rate in either continuous mode or in the mode of synchronized data frames.

However, there is a need for a system and method that provide a possibility to process finite length encoded data packets/data frames for the following construction types: an arbitrary-tail construction; a direct truncation construction; a tail-biting (circular) construction. There is also a need to provide multi-channel capability, as well as capability for decoding of the continuous encoded streams, as well as finite length encoded data packets.

SUMMARY OF THE INVENTION

Accordingly, the present invention is related to a system and method for processing finite length encoded data packets/data frames for the following construction types: an arbitrary-tail construction; a direct truncation construction; a tail-biting (circular) construction that substantially obviates one or more of the disadvantages of the related art.

A system in accordance with an exemplary embodiment uses a sequential Viterbi decoder. The Viterbi decoder includes: an input data buffer, a "Read Single Data Word from Input Data Buffer" signal driver, a processing unit selector, a decoder channel parameters registers unit, a processing unit for the "Reset Path Metrics" command, a processing unit for the "Set Path Metric Value for the Given Path Number" command, a processing unit for the "Get Single Bit from the Path with Given Number" command, a processing unit for the "Process Input Samples" command, a decoding paths and path metrics RAM, a unit for generating current decoder channel base address for the decoding paths and path metrics RAM, a unit for generating cell address for the decoding path and path metric RAM, and a data buffers unit for decoder channels output. The proposed decoder uses processing units that are common for all channels and a RAM array for paths and path metrics specifically allocated between channels (extra units for multichannel addressing are added). Thus, sequential multichannel processing is provided. Specific set of processing units are used (extra processing units are added to the set), whose operation is enabled externally by issuing commands to the input data buffer, depending on the type of encoded data slicing. This provides the capability for continuous stream or encoded data packets processing selectively for each decoder channel.

According to the exemplary embodiment, inputs/outputs of the processing units for commands: "Reset Path Metrics", "Set Path Metric Value for the Given Path Number", "Get Single Bit from the Path with Given Number", "Process Input Samples" and their first outputs are connected by first and second buses, respectively. The first input of the unit for generating cell address for the decoding path and path metric RAM is also connected to the second bus.

The second and the third inputs of the unit for generating cell address for the decoding path and path metric RAM are connected to the first and the second outputs of the computation unit respectively for generating current decoder channel base address for the decoding paths and path metrics RAM whose first input is connected to the first inputs of the decoder channel parameter registers unit, to the data buffers unit for decoder channels output and to the first output of the input data buffer, whose second output is connected to the first input of the processing unit selector.

The second input of the processing unit selector is connected to the input of the input buffer and the output of the "Read Single Data Word from Input Data Buffer" signal driver. The first input of the signal driver is connected to the third output of the input buffer. The fourth and fifth outputs of the input buffer are connected to the first and second inputs of the processing unit for the "Set Path Metric Value for the Given Path Number" command.

The sixth output of the input buffer is connected to the first input of the processing unit for the "Process Input Samples" command. The output of the unit for generating cell address for the decoding path and path metric RAM is connected to the input of the decoding paths and path metrics RAM which is connected to the first bus.

The second input of the "Read Single Data Word from Input Data Buffer" signal driver is connected to the second input of the unit for generating current decoder channel base address for the decoding paths and path metrics RAM and to the second output of the processing unit for the "Process Input Samples" command.

The processing unit for the "Get Single Bit from the Path with Given Number" command and the processing unit for the "Process Input Samples" command are connected to the second input of the data buffers unit for decoder channels output. The second outputs of the processing units for the "Reset Path Metrics," "Set Path Metric Value for the Given Path Number" and "Get Single Bit from the Path with Given Number" commands are respectively connected to the third, fourth and fifth inputs of the "Read Single Data Word from Input Data Buffer" signal driver.

The outputs of the processing unit selector are correspondingly connected to the second inputs of the processing units for "Reset Path Metrics," "Get Single Bit from the Path with Given Number" and "Process Input Samples" commands, as well as to the third input of the processing unit for the "Set Path Metric Value for the Given Path Number" command. The third inputs of the processing units for the "Get Single Bit from the Path with Given Number" and "Process Input Samples" commands are connected to the first output of the decoder channels parameters registers unit, the second output of which is connected to the fourth input of the processing unit for the "Process Input Samples" command.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention. In the drawings:

FIG. 3 illustrates a table displaying exemplary possible values at the input of the multi-channel sequential Viterbi decoder.

DETAILED DESCRIPTION OF THE PREFERRED EMBODIMENTS

Figure 1:
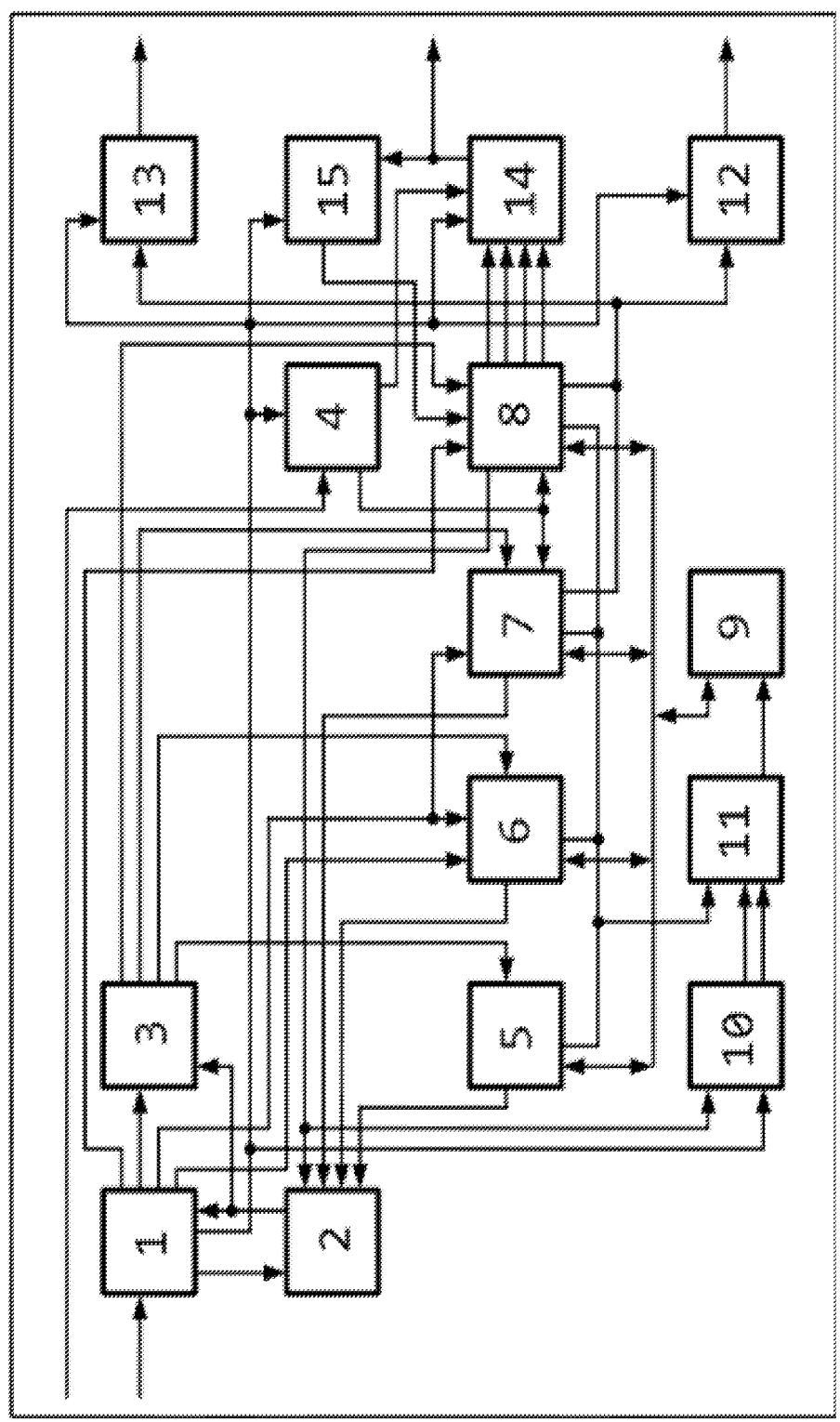
FIG. 1 illustrates a block diagram of a multi-channel sequential Viterbi decoder, in accordance with the exemplary embodiment.
Figure 2:
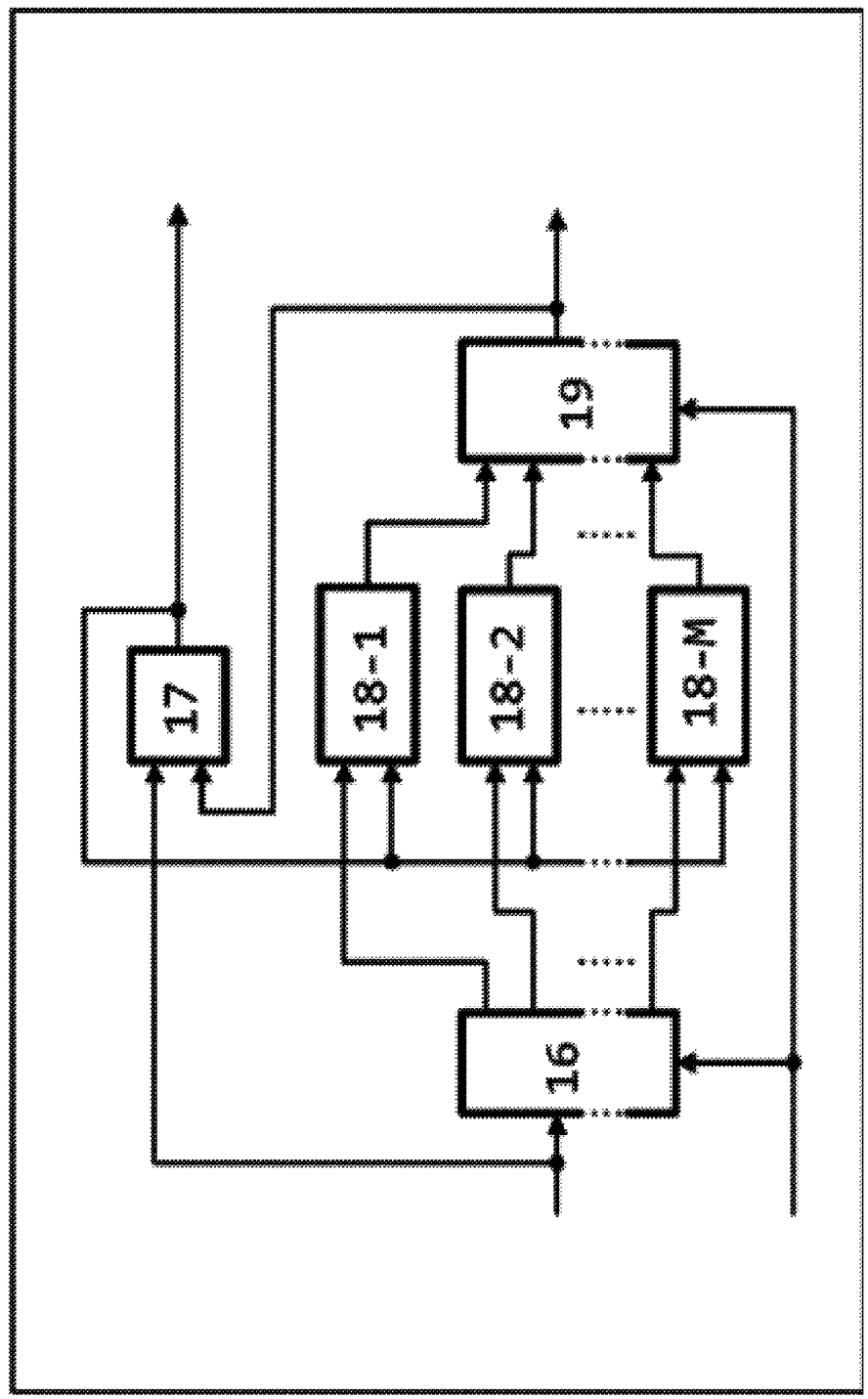
FIG. 2 illustrates a block diagram of the unit for generating current decoder channel base address for the decoding paths and path metrics RAM, in accordance with the exemplary embodiment.

Reference will now be made in detail to the preferred embodiments of the present invention, examples of which are illustrated in the accompanying drawings.

The present invention is directed to a system and method for processing finite length encoded data packets/data frames for the following construction types: an arbitrary-tail construction; a direct truncation construction; a tail-biting (circular) construction A system, in accordance with the exemplary embodiment includes: a decoder channels output data counter unit, an integrators unit, and a conditional probability density distribution parameters computation unit for computing branch metrics. The output of the conditional probability density distribution parameters computation unit is connected to the fifth input of the processing unit for the "Process Input Samples" command and its input is connected to the first inputs of the decoder channels output data counter unit, to the integrators unit, and to the first output of the input buffer.

According to the exemplary embodiment, the second input of the decoder channels output data counter unit is connected to the second input of the data buffers unit for decoder channels output. The fourth outputs of the processing unit for command "Process Input Samples" are connected to the second inputs of the integrators unit, while the third inputs of which are connected to the third outputs of the decoder channels parameters registers unit.

Another embodiment is the unit for generating current decoder channel base address for the decoding paths and path metrics RAM. This unit comprises: a selector, a decoding paths and path metrics RAM free area base address register, a decoding paths and path metrics RAM workspace area base addresses register file and a multiplexer. Note that the number of registers in the register file is equal to the number of decoder channels.

One of the inputs of the unit for generating current decoder channel base address for the decoding paths and path metrics RAM is connected to (i.e., assigned as) one of the selector inputs and the input of the decoding paths and path metrics RAM free area base address register. The other input of the unit for generating current decoder channel base address for the decoding paths and path metrics RAM is connected to (i.e., assigned as) the other input of the selector and one of the inputs of the multiplexor.

According to one embodiment, the other inputs of the multiplexor are connected to the outputs of registers of the decoding paths and path metrics RAM base addresses register file. The outputs of the selector are connected to the registers inputs of the decoding paths and path metrics RAM workspace area base addresses register file. The other registers inputs of the decoding paths and path metrics RAM workspace area base addresses register file are connected to the output of the decoding paths and path metrics RAM free workspace area base address register, which is also connected to the output of the unit for generating current decoder channel base address for the decoding paths and path metrics RAM.

The multiplexor output is connected to the output of the unit for generating current decoder channel base address for the decoding paths and path metrics RAM and is connected to the second input of the decoding paths and path metrics RAM free area base address register.

A multi-channel sequential Viterbi decoder, in accordance with the exemplary embodiment, comprises: input data buffer 1, "Read Single Data Word from Input Data Buffer" signal driver 2, see discussion below, processing unit selector 3, see discussion below decoder channels parameters registers unit 4, processing unit for the "Reset Path Metrics" command 5, processing unit for the "Set Path Metric Value for the Given Path Number" command 6, processing unit for the "Get Single Bit from the Path with Given Number" command 7, processing unit for the "Process Input Samples" command 8, decoding paths and path metrics RAM 9, unit for generating current decoder channel base address for the decoding paths and path metrics RAM 10, unit for generating cell address for the decoding path and path metric RAM 11 and data buffers unit for decoder channels output 12 as well as decoder channels output data counter unit 13, an integrators unit 14 and conditional probability density distribution parameters computation unit 15.

A unit for generating current decoder channel base address for the decoding paths and path metrics RAM 10 includes selector 16, decoding paths and path metrics RAM free area base address register 17, decoding paths and path metrics RAM workspace area base addresses register file 18-1, 18-2 ... 18-M (the number of registers M is determined by the number of decoder channels and multiplexor 19. Typical number of decoder channels is determined by the particular task, for example, for processing of the data transmission channels from "all-in-view" satellites of the GNSS M=31 is sufficient.).

According to the exemplary embodiment, the multi-channel sequential Viterbi decoder functions as follows. An input data word which consists of the "decoder channel number," "command code," "decoding path number," "path metric value" and "samples to be processed" fields comes to the input buffer 1 from the input of the multi-channel sequential Viterbi decoder. This data word is held in the input buffer as long as the Viterbi decoder units process data words delivered earlier. Here, "input data word" is elementary basic information unit written to the input buffer 1. Input data word has several fields: "decoder channel number" (mandatory), "command code" (mandatory), some data fields (dependent on the command). See discussion below for behavior during processing of the different types of sequences.

The depth of the input buffer 1 is selected based on the relationship between the peak data word rate and max processing time for the data word in the "slowest" of the command processing units 5, 6, 7 or 8. The processing unit for the "Process Input Samples" command 8 is generally the slowest unit where most operations are performed for data word processing.

If input data buffer 1 contains at least one data word the input data buffer 1 generates a signal which comes to the input of "Read Single Data Word from Input Data Buffer" signal driver 2 along with signals from command processing units 5, 6, 7 or 8, which indicate that respective units are ready to process next data word. If ([input data buffer 1 contains at least one data word] and [command processing unit 5 is ready to process next data] and [command processing unit 6 is ready to process next data] and [command processing unit 7 is ready to process next data] and [command processing unit 8 is ready to process next data]) then [generate a strobe signal to read one data word from input data buffer 1]. This is informally described in the next paragraph.

If all the command processing units 5, 6, 7 or 8 are ready to process next data word (active state of signals) and input data buffer 1 contains at least one data word then "Read Single Data Word from Input Data Buffer" signal driver 2 generates a read signal to read out one data word from the input data buffer 1. Values of the fields read from the data word come to the inputs of the command processing units 5, 6, 7 or 8.

Value of the "decoder channel number" field is delivered to the inputs of:
 decoder channels parameters registers unit 4 where a register with the current channel parameter values is selected. Channel parameters are further used for operation of processing unit for the "Get Single Bit from the Path with Given Number" command 7 and processing unit for the "Process Input Samples" command 8;
 data buffers unit for decoder channels output 12 where a buffer for storing output decoder data for the current channel is selected. Output decoder data is generated in the processing unit for the "Get Single Bit from the Path with Given Number" command 7 or in the processing unit for the "Process Input Samples" command 8;
 decoder channels output data counter unit 13 where a ring counter register for the current channel is selected, which counts the number of output bits generated by processing unit for the "Get Single Bit from the Path with Given Number" command 7 or by processing unit for the "Process Input Samples" command 8;
 integrators unit 14 where integrators are chosen to generate an average value of current channel parameter quality estimates generated during the operation of the processing unit for the "Process Input Samples" command 8;
 conditional probability density distribution parameters computation unit 15 where branch metrics are computed and where a register with parameter values of the current channel is used for branch metrics computation in the processing unit for the "Process Input Samples" command 8;
 unit for generating current decoder channel base address for the decoding paths and path metrics RAM 10 where decoding paths and path metrics RAM base address for the current channel and free area base address for the decoding paths and path metrics RAM 9 are generated.

A value from the command code field is provided to processing unit selector 3 where one of "operation start" signals for units 5, 6, 7 or 8 is generated depending on the field value. Processing unit selector 3 acts as a command code field decoder with "enable" input i.e. If command code field equals to "Reset Path Metrics" command code and enable signal from "Read Single Data Word from Input Data Buffer" signal driver 2 is active then generate "operation start" signal for processing unit for the "Reset Path Metrics" command 5. If command code field equals to "Set Path Metric Value for the Given Path Number" command code and enable signal from "Read Single Data Word from Input Data Buffer" signal driver 2 is active then generate "operation start" signal for processing unit for the "Set Path Metric Value for the Given Path Number" command 6. If command code field equals to "Get Single Bit from the Path with Given Number" command code and enable signal from "Read Single Data Word from Input Data Buffer" signal driver 2 is active then generate "operation start" signal for processing unit for the "Get Single Bit from the Path with Given Number" command 7. If command code field equals to "Get Single Bit from the Path with Given Number" command code and enable signal from "Process Input Samples" signal driver 2 is active then generate "operation start" signal for processing unit for the "Process Input Samples" command 8. Decoding paths and path metrics RAM 9 consists of cells that include a decoding path field and a path metric field. The decoding path filed width is equal to the longest decoding path among all decoder channels and corresponds to the maximum possible permitted parameter value from decoder channels parameters registers unit 4.

Decoding paths and path metrics RAM 9 is nominally split into M+1 areas, M of which store current decoding paths and path metrics for each decoder channel and one area is free and used for writing decoding paths and path metrics being changed according to the Viterbi decoder algorithm during operation of the processing unit for the "Process Input Samples" command 8. All areas contain the equal number of RAM cells having sequential addresses. This number is determined by the maximum order and properties of the allowed generator polynomials of the coders under decoding.

During processing of the current data word the base address of the decoding paths and path metrics RAM workspace area for the current decoder channel is generated in unit 10 based on the current decoder channel number CHAN. This address is stored in the register having the same number as the current decoder channel in the unit for generating current decoder channel base address for the decoding paths and path metrics RAM 10. In the same unit the base address of the free RAM area is generated. The address is stored at the specially assigned register of the unit for generating current decoder channel base address for the decoding paths and path metrics RAM 10.

During their operation command processing units 5, 6, 7 and 8 each generate a signal that selects either workspace or free RAM areas and a cell offset address relative to the base address of the required area. An absolute (i.e., global) cell address of decoding paths and path metrics RAM 9 is generated in the unit for generating cell address for the decoding paths and path metric RAM 11. Besides generating workspace and free RAM area selector signal command processing units 5, 6, 7 and 8 generate read and write signals for the decoding path and path metrics RAM 9 as well as read and write RAM cells contents.

At the beginning of multi-channel Viterbi decoder operation (after reset) registers 18-1,18-2 ... 18-M of the decoding paths and path metrics RAM workspace area base addresses register file contain initial base addresses of RAM workspace areas corresponding to the decoder channels. The decoding paths and path metrics RAM free area base address register 17 contains the base address of the decoding paths and path metrics free RAM area.

A value from the field of the current decoder channel number is passed to the input of multiplexor 19 which generates a base address of RAM workspace area corresponding to the current decoder number CHAN at its output. Free RAM area base address is generated at the output of the decoding paths and path metrics RAM free area base address register 17.

A value from the current decoder channel field is passed to the input of selector 16. After the processing unit for the "Process Input Samples" command 8 completes processing of one set of input samples (i.e., unit output status signal changes its state from active to inactive), an enabling signal is generated at one of the outputs of the selector 16 corresponding to the current decoder channel CHAN. This enabling signal is passed to the write enable input of one of the registers 18-1,18-2 ... 18-M from decoding paths and path metrics RAM base addresses workspace area register file which corresponds to the current decoder channel CHAN. A base address of RAM free area from the output of the decoding paths and path metrics RAM free area base address register 17 comes to the data inputs of registers 18-1,18-2 ... 18-M of the decoding paths and path metrics RAM workspace area base addresses register file.

An "operation complete" output signal of the processing unit for the "Process Input Samples" command 8 goes directly of the write enable input of the decoding paths and path metrics RAM free area base address register 17. At the data input of the decoding paths and path metrics RAM free area base address register 17 there is base address of the RAM workspace area corresponding to the current decoder channel number CHAN from the output of multiplexor 19.

Thus, after the processing unit for the "Process Input Samples" command 8 completes its operation the contents of the decoding paths and path metrics RAM free area base address register 17 exchanges with the contents of one of the registers 18-1,18-2 ... 18-M from decoding paths and path metrics RAM base addresses register file and which corresponds to the decoder channel number CHAN that has been just processed—i.e., the area to where decoding paths and path metrics changed in according to Viterbi decoder algorithm have been written during the operation of the processing unit for the "Process Input Samples" command 8 for the decoder channel that has been just processed becomes a workspace area for this decoder channel.

When the operation of the processing unit for the "Reset Path Metrics" command 5 is enabled, it sets all path metrics to "0" and all decoding paths positions to "0" in a workspace area of the decoding paths and path metrics RAM 9 with base address generated on the output of the unit for generating current decoder channel base address for the decoding paths and path metrics RAM 10 for the current decoder channel number CHAN.

At the beginning of this operation the processing unit for the "Reset Path Metrics" command 5 sets "Ready to Process Next Data Word" signal to inactive state. When the operation has completed the processing unit for the "Reset Path Metrics" command 5 sets "Ready to Process Next Data Word" signal to active state.

When the operation of the processing unit for the "Set Path Metric Value for the Given Path Number" command 6 is enabled it assigns path metric field of the decoding paths and path metrics RAM 9 cell from the area with the base address generated on the output of the unit for generating current decoder channel base address for the decoding paths and path metrics RAM 10 and the offset corresponding to the "decoding path number" field value (absolute cell address is generated on the output of the unit for generating cell address for the decoding paths and path metric RAM 11) to a value from "path metric value" field of the current data word read from the input buffer 1.

The decoding path does not change during this operation. At the beginning of this operation the processing unit for the "Set Path Metric Value for the Given Path Number" command 6 sets "Ready to Process Next Data Word" signal to inactive state. When the operation has completed the processing unit for the "Set Path Metric Value for the Given Path Number," command 6 sets "Ready to Process Next Data Word" signal to active state.

When the operation of the processing unit for the "Get Single Bit from the Path with Given Number" command 7 is enabled, it reads one bit from decoding path field of the decoding paths and path metrics RAM 9 cell from the area with the base address generated on the output of the unit for generating current decoder channel base address for the decoding paths and path metrics RAM 10 and the offset corresponding to the "decoding path number" field value (absolute cell address is generated at the output of the unit for generating cell address for the decoding paths and path metric RAM 11).

The position of this bit in the decoding path field is determined by the value set in the decoder channels parameters registers unit 4 for the current decoder channel. At the beginning of this operation the processing unit for the "Get Single Bit from the Path with Given Number" command 7 sets "Ready to Process Next Data Word" signal to inactive state. When the operation has completed the processing unit for the "Get Single Bit from the Path with Given Number" command 7 sets "Ready to Process Next Data Word" signal to active state.

When the operation of the processing unit for the "Process Input Samples" command 8 is enabled, it performs main decoding stages for the current decoder channel according to the Viterbi algorithm: computing branch metrics and updating path metrics and decoding paths fields ("add-compare-select" operation) of the decoding paths and path metrics RAM 9 cells for the current decoder channel. The number of cells to be processed is determined by the order and properties of the generator polynomials for the current decoder channel which are passed from the decoder channels parameters registers unit 4 to the processing unit for the "Process Input Samples" command 8 based upon the current decoder channel number CHAN.

Updated path metrics and decoding paths values are written to the decoding paths and path metrics RAM free area. During its operation, the processing unit for the "Process Input Samples" command 8 saves (in its internal memory) the decoding path for which path metric value corresponds to the maximum likelihood ratio. After processing of all the fields of path metrics and decoding paths for the current decoder channel the processing unit for the "Process Input Samples" command 8 reads out one bit from the saved decoder path. The position of this bit in saved decoding path is determined by the value set in the decoder channels parameters registers unit 4 for the current decoder channel number CHAN.

At the beginning of this operation the processing unit for the "Process Input Samples" command 8 sets "Ready to Process Next Data Word" signal to inactive state. When the operation has completed, the "Process Input Samples" command 8 sets "Ready to Process Next Data Word" signal to active state.

In addition, processing unit for the "Process Input Samples" command 8 generates channel quality estimates and probabilities of decoding errors. These estimates are passed to the integrators unit 14 where they are averaged out. Integrators parameters (integration time constants) for each of the estimates of the current decoder channel are transmitted to integrators unit 14 from decoder channels parameters registers unit 4.

According to the exemplary embodiment, integrator output values can be read by an external device to make a decision about the channel signal quality and synchronization correctness of the decoder channels. Unit 15 performs computation of conditional probability density distribution parameters and channels quality estimates and probabilities of decoding errors and transforms them into channel signal-to-noise ratio value. This value is used in calculation of branch metrics (conditional probabilities) which, advantageously, enables to reduce error probability of decoding.

A single bit obtained in operation of the processing unit for the "Get Single Bit from the Path with Given Number" command 7 or the processing unit for the "Process Input Samples" command 8 is passed to the input of the shift register corresponding to the current decoder channel CHAN in the data buffers unit for decoder channels output 12. At the same time the ring counter corresponding to the current decoder channel CHAN increments its value in decoder channels output data counter unit 13.

Register values of units 12 and 13 can be read by an external device for further processing of decoded data. A delay in the transmission channel is equal to a sum of the coder code constraint length and decoding path length for the given decoder channel set in the decoder channels parameters registers unit 4.

According to the exemplary embodiment, processing of punctured convolutional codes is performed as follows. Input samples for the processing unit for the "Process Input Samples" command 8 can be represented in a signed format (see, for example, Table 1). Presence of the so-called "undefined value" or "erasure", i.e. input sample value for which conditional probabilities of all possibly transmitted symbols are equal, allows for decoding of the punctured convolutional codes by adding "undefined values" to the sequence of input samples in the positions corresponding to zeros of the puncturing matrix.

Processing of continuous encoded streams is implemented as follows. When a continuous encoded stream is about to be processed by a decoder channel, generator polynomials of the coder, decoding path length, integrators parameters (response time) for averaging of channel quality figures estimated during decoding process are set in the decoder channels parameters registers unit 4 for the given decoder channel.

Then, a data word with "command code" field value corresponding to "Reset Path Metrics" command and with the "decoder channel number" field corresponding to the decoder channel in which decoding is going to be implemented is written to the input buffer 1. Subsequent data words and the "command code" field value corresponding to the "Process Input Samples" command and "decoder channel number" field corresponding to the decoder channel (in which decoding is implemented) and "samples to be processed" field containing samples received from data link channel and intended for processing are written to the input buffer 1. Decoded data bits are read from a buffer corresponding to the current decoder channel in the data buffers unit for decoder channels output 12.

According to the exemplary embodiment, processing of finite length encoded blocks having arbitrary-tail construction is implemented as follows. When a finite length encoded block with arbitrary-tail construction is about to be processed by a decoder channel, generator polynomials of the coder, decoding path length, integrators parameters (response time) for averaging of channel quality figures estimated during decoding process are set in the decoder channels parameters registers unit 4 for the given decoder channel. Then, a data word with "command code" field value corresponding to "Reset Path Metrics" command and with the "decoder channel number" field corresponding to the decoder channel (in which decoding is going to be implemented) is written to the input buffer 1. Next, a data word with "command code" field value corresponding to the "Set Path Metric Value for the Given Path Number" command, with the "decoder channel number" field corresponding to the decoder channel (in which decoding is going to be implemented) with "decoding path number" field corresponding to the known initial state of the convolutional coder (typically zero) and with path metric field corresponding to the maximum possible "path metric value" field are written into the input buffer 1.

Subsequent data words with the "command code" field value corresponding to the "Process Input Samples" command with "decoder channel number" field corresponding to the decoder channel (in which decoding is implemented), with "samples to be processed" field containing samples received from data link channel and intended for processing are written to the input buffer 1.

Upon reception of the encoded block, the "command code" field value corresponding to the "Get Single Bit from the Path with Given Number" command and the "decoder channel number" field corresponding to the decoder channel from which decoded data is going to be read and "decoding path number" field corresponding to the known final state of the convolutional coder are written to the input buffer 1. Decoded data bits are read from a buffer corresponding to the current decoder channel in the data buffers unit for decoder channels output 12.

According to another exemplary embodiment, processing finite length encoded blocks with direct truncation construction is implemented as follows. When a finite length encoded block with direct truncation construction is going to be processed by a decoder channel, generator polynomials of the coder, decoding path length, integrators parameters (response time) for averaging of channel quality figures estimated during decoding process are set in the decoder channels parameters registers unit 4 for the given decoder channel.

Then, a data word with "command code" field value corresponding to "Reset Path Metrics" command and the "decoder channel number" field corresponding to the decoder channel (in which decoding is going to be implemented) are written to the input buffer 1. Next, a data word with "command code" field value corresponding to the "Set Path Metric Value for the Given Path Number" command and the "decoder channel number" field corresponding to the decoder channel in which decoding is going to be implemented and "decoding path number" field corresponding to the known initial state of the convolutional coder (typically zero) and path metric field corresponding to the maximum possible "path metric value" field are written into the input buffer 1.

Subsequent data words with the "command code" field value corresponding to the "Process Input Samples" command and "decoder channel number" field corresponding to the decoder channel in which decoding is implemented and "samples to be processed" field containing samples received from data link channel and intended for processing are written to the input buffer 1.

Upon completion of receiving the encoded block series of data words with the "command code" field value corresponding to the "Process Input Samples" command and "decoder channel number" field corresponding to the decoder channel (in which decoding is implemented) and "samples to be processed" field containing "undefined values" of input samples are written to the input buffer 1. Decoded data bits are read from a buffer corresponding to the current decoder channel in the data buffers unit for decoder channels output 12.

Processing of finite length encoded blocks with tail-biting construction is performed as follows. When a finite length encoded block with tail-biting construction is about to be processed by a decoder channel, generator polynomials of the coder, decoding path length, integrators parameters (response time) for averaging of channel quality figures estimated during decoding process are set in the decoder channels parameters registers unit 4 for the given decoder channel. Then a data word with "command code" field value corresponding to "Reset Path Metrics" command and the "decoder channel number" field corresponding to the decoder channel (in which decoding is going to be implemented) are written to the input buffer 1.

Subsequent data words with the "command code" field value corresponding to the "Process Input Samples" command and "decoder channel number" field corresponding to the decoder channel (in which decoding is implemented) and "samples to be processed" field containing samples received from data link channel and intended for processing are written to the input buffer 1.

Upon completion of receiving the encoded block data words and the "command code" field value corresponding to the "Get Single Bit from the Path with Given Number" command and the "decoder channel number" field corresponding to the decoder channel from which decoded data is going to be read and with "decoding path number" field corresponding to the initial state of the convolutional coder (which is defined by K first bits of the data block, K is the code constraint length) are written to the input buffer 1. Decoded data bits are read from a buffer corresponding to the current decoder channel in the data buffers unit for decoder channels output 12.

Having thus described a preferred embodiment, it should be apparent to those skilled in the art that certain advantages of the described method and apparatus have been achieved.

It should also be appreciated that various modifications, adaptations, and alternative embodiments thereof may be made within the scope and spirit of the present invention. The invention is further defined by the following claims.

What is claimed is:

1. A multi-channel sequential Viterbi decoder comprising:
an input data buffer;
a signal driver for reading a single data word from the input data buffer;
a processing unit selector;
a decoder channels parameters registers unit;
a processing unit for resetting path metrics;
a processing unit for setting a path metric value based on a path number;
a processing unit for getting a single bit from the path with assigned number;
a processing unit for processing input samples;
a decoding paths and path metrics random access memory (RAM);
a unit for generating current decoder channel base address for the decoding paths and the path metrics RAM;
a unit for generating cell address for the decoding path and the path metric RAM; and
a data buffers unit for decoder channels output, wherein:
inputs and outputs of the processing units are connected by first and second buses;
a first input of the unit for generating cell address for the decoding path and path metric RAM is connected to the second bus;
a second and a third inputs of the unit for generating cell address are connected to first and second outputs of the unit for generating current decoder channel base address for the decoding paths and the path metrics RAM;
a first input of the unit for generating current decoder channel base address for the decoding paths and the path metrics RAM is connected to a first input of the decoder channel parameter registers unit and to a first output of the input data buffer;
a second output of the input data buffer is connected to a first input of the processing unit selector;

a second input of the processing unit selector is connected to the second input of the input buffer and to an output of the signal driver;
a first input of the signal driver is connected to a third output of the input buffer;
a fourth and a fifth outputs of the processing unit selector are connected to a first and a second inputs of the processing unit for setting the path metric value; and
a sixth output of the input buffer is connected to a first input of the processing unit for processing input samples.

2. The decoder of claim 1, wherein the single data word includes any of a decoder channel number, a command code, a decoding path number, a path metric value and samples to be processed fields.

3. The decoder of claim 1, wherein the single data word includes a path metric value.

4. The decoder of claim 1, wherein the single data word includes a command code that defines whether one of (i) a decoding path number field, (ii) a path metric value field and (iii) samples to be processed field, is transmitted to the input data buffer.

5. The decoder of claim 1, wherein the input data buffer is a first-in-first-out (FIFO) buffer.

6. The decoder of claim 1, wherein data buffers in the data buffers unit for decoder channels output are first-in-first-out (FIFO) buffers.

7. The decoder of claim 1, wherein data buffers in the data buffers unit for decoder channels output are shift registers.

8. The decoder of claim 1, wherein the processing unit for processing input samples includes "add-compare-select" operation blocks.

9. The decoder of claim 1, wherein decoding paths and path metrics random access memory (RAM) include cells that store decoding path history and path metric value.

10. The decoder of claim 1, further comprising:
a decoder channel output data counter unit;
an integrator unit connected to an output of the processing unit for processing input samples; and
a computation unit for computing branch metrics using conditional probability density distribution parameters connected to an output of the integrator unit, wherein:
an output of the computation unit is connected to a fifth input of the processing unit;
an input of the computation unit is connected to a first input of the decoder channels output data counter unit, to a first input of the integrator unit and to the first output of the input buffer;
a second input of the decoder channels output data counter unit is connected to a second input of the data buffers unit for decoder channels output;
fourth outputs of the processing unit are connected to second inputs of the integrator unit; and
third inputs of the integrators unit are connected to a third outputs of the decoder channels parameters registers unit.

11. The decoder of claim 10, wherein the decoder channels parameters registers unit includes any of decoding path length, coder generator polynomials' coefficients, puncturing coefficients, and integrators' parameters for integrator unit.

12. The decoder of claim 10, wherein counters in the decoder channel output data counter unit are circular counters.

13. The decoder of claim 10, wherein the integrator unit implements "integrate and dump" operation for finite length encoded block processing.

14. The decoder of claim 10, wherein the integrator unit implements a "moving average" operation for infinite length encoded streams processing.

15. The decoder of claim 10, wherein the integrator unit implements a "proportional integration" operation for infinite length encoded streams processing.

16. The decoder of claim 10, wherein the computation unit implements minimum and maximum path metrics difference calculation.

17. The decoder of claim 10, wherein the computation unit implements a direct input bit error rate calculation, and includes a hard limiter, a delay line, a coder, and a comparator.

18. A decoder for generating current decoder channel base address for a decoding paths and path metrics RAM, the decoder comprising:
a selector,
a decoding paths and path metrics RAM free area base address register;
a decoding paths and path metrics RAM workspace area base addresses register file, wherein a number of registers in register file equals to a number of decoder channels; and
a multiplexer, wherein:
at least one input of the unit for generating current decoder channel base address is connected to one input of the selector and to one input of the decoding paths and path metrics RAM free area base address register;
at least one input of the unit for generating current decoder channel base address is connected to another input of the selector and to one input of the multiplexor;
other inputs of the multiplexor are connected to outputs of registers of the decoding paths and path metrics RAM base addresses register file;
outputs of the selector are connected to the registers inputs of the decoding paths and path metrics RAM workspace area base addresses register file;
other inputs of the decoding paths and path metrics RAM workspace area base addresses register file are connected to an output of the decoding paths and path metrics RAM free workspace area base address register;
the decoding paths and path metrics RAM free workspace area base address register is connected to an output of the unit for generating current decoder channel base address for the decoding paths and path metrics RAM; and
an output of the multiplexor is connected to an output of the unit for generating current decoder channel base address for the decoding paths and path metrics RAM and is connected to a second input of the decoding paths and path metrics RAM free area base address register.

19. The unit of claim 18, wherein decoding paths and path metrics RAM free area base address register and each register in the decoding paths and path metrics RAM workspace area base addresses register file store unique addresses of the decoding paths and path metrics RAM.

20. The unit of claim 18, wherein decoding paths and path metrics RAM free area base address register and each register in the decoding paths and path metrics RAM workspace area base addresses register file store unique addresses of the decoding paths and path metrics RAM that are equally spaced.

* * * * *